(12) United States Patent
Kameyama

(10) Patent No.: US 8,018,570 B2
(45) Date of Patent: *Sep. 13, 2011

(54) EXPOSURE APPARATUS AND DEVICE FABRICATION METHOD

(75) Inventor: Masaomi Kameyama, Tokyo (JP)

(73) Assignee: Nikon Corporation, Tokyo (JP)

( * ) Notice: Subject to any disclaimer, the term of this patent is extended or adjusted under 35 U.S.C. 154(b) by 183 days.

This patent is subject to a terminal disclaimer.

(21) Appl. No.: 11/808,406

(22) Filed: Jun. 8, 2007

(65) Prior Publication Data

US 2008/0030697 A1 Feb. 7, 2008

Related U.S. Application Data

(60) Division of application No. 11/230,572, filed on Sep. 21, 2005, which is a continuation of application No. PCT/JP2004/003928, filed on Mar. 23, 2004.

(30) Foreign Application Priority Data

Mar. 25, 2003 (JP) ................... 2003-083329

(51) Int. Cl.
  *G03B 27/32* (2006.01)
  *G03B 27/42* (2006.01)
  *G03B 27/52* (2006.01)
  *G03B 27/58* (2006.01)
(52) U.S. Cl. ................ 355/30; 355/53; 355/72; 355/77
(58) Field of Classification Search .............. 355/30, 355/53, 67, 72, 75, 77; 378/34, 35; 250/492.2
  See application file for complete search history.

(56) References Cited

U.S. PATENT DOCUMENTS

| 4,346,164 | A | 8/1982 | Tabarelli et al. |
| 4,480,910 | A | 11/1984 | Takanashi et al. |
| 4,704,348 | A | 11/1987 | Koizumi et al. |
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |
| 5,874,820 | A | 2/1999 | Lee |
| 5,892,572 | A | 4/1999 | Nishi |
| 6,788,477 | B2 | 9/2004 | Lin |

(Continued)

FOREIGN PATENT DOCUMENTS

DE  221 563 A1  9/1983

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

This exposure system projects a pattern image onto a substrate via a projection optical system and a liquid to expose the substrate, with a space between the projection optical system and the substrate filled with the liquid. The exposure system is provided with a vaporization preventing unit for preventing the vaporization of the liquid.

22 Claims, 5 Drawing Sheets

U.S. PATENT DOCUMENTS

| | | | |
|---|---|---|---|
| 7,397,533 B2 * | 7/2008 | Verhagen et al. | 355/53 |
| 7,471,371 B2 | 12/2008 | Kameyama | |
| 7,652,746 B2 * | 1/2010 | Jacobs et al. | 355/30 |
| 7,751,027 B2 * | 7/2010 | Jacobs et al. | 355/30 |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068499 A1 | 3/2005 | Dodoc et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0225737 A1 | 10/2005 | Weissenrieder et al. | |
| 2005/0270505 A1 | 12/2005 | Smith | |
| 2005/0275817 A1 | 12/2005 | Nakata | |
| 2006/0001851 A1 | 1/2006 | Grant et al. | |
| 2006/0119809 A1 | 6/2006 | Verhagen et al. | |
| 2007/0070315 A1 | 3/2007 | Jacobs et al. | |
| 2007/0070316 A1 | 3/2007 | Ehrmann et al. | |
| 2007/0263196 A1 | 11/2007 | Hirukawa et al. | |
| 2008/0291407 A1 * | 11/2008 | Verhagen et al. | 355/30 |

FOREIGN PATENT DOCUMENTS

| | | | |
|---|---|---|---|
| DE | 224 448 A1 | | 3/1984 |
| JP | A 57-152129 | | 9/1982 |
| JP | A-57-152129 | | 9/1982 |
| JP | A-57-153433 | | 9/1982 |
| JP | A-58-202448 | | 11/1983 |
| JP | A-59-019912 | | 2/1984 |
| JP | A-62-065326 | | 3/1987 |
| JP | A 62-65326 | | 3/1987 |
| JP | A-63-157419 | | 6/1988 |
| JP | A-04-305915 | | 10/1992 |
| JP | A-04-305917 | | 10/1992 |
| JP | A-05-062877 | | 3/1993 |
| JP | A 6-29204 | | 2/1994 |
| JP | A 6-124873 | | 5/1994 |
| JP | A 7-220990 | | 8/1995 |
| JP | A-8-166475 | | 6/1996 |
| JP | A-08-316125 | | 11/1996 |
| JP | A 8-330224 | | 12/1996 |
| JP | A 10-163099 | | 6/1998 |
| JP | A 10-214783 | | 8/1998 |
| JP | A 10-255319 | | 9/1998 |
| JP | 10303114 A * | | 11/1998 |
| JP | A 10-303114 | | 11/1998 |
| JP | A 10-340846 | | 12/1998 |
| JP | A 11-176727 | | 7/1999 |
| JP | A 2000-58436 | | 2/2000 |
| JP | A 2000-505958 | | 5/2000 |
| WO | WO 98/28665 A1 | | 7/1998 |
| WO | WO 99/49504 A1 | | 9/1999 |
| WO | WO 02/091078 A1 | | 11/2002 |
| WO | WO 03/077037 A1 | | 9/2003 |
| WO | WO 2004/019128 A2 | | 3/2004 |
| WO | WO 2004/055803 A1 | | 7/2004 |
| WO | WO 2004/057589 A1 | | 7/2004 |
| WO | WO 2004/057590 A1 | | 7/2004 |
| WO | WO 2004/077154 A2 | | 9/2004 |
| WO | WO 2004/081666 A1 | | 9/2004 |
| WO | WO 2004/090577 A2 | | 10/2004 |
| WO | WO 2004/090633 A2 | | 10/2004 |
| WO | WO 2004/090634 A2 | | 10/2004 |
| WO | WO 2004/092830 A2 | | 10/2004 |
| WO | WO 2004/092833 A2 | | 10/2004 |
| WO | WO 2004/093130 A2 | | 10/2004 |
| WO | WO 2004/093159 A2 | | 10/2004 |
| WO | WO 2004/093160 A2 | | 10/2004 |
| WO | WO 2004/095135 A2 | | 11/2004 |
| WO | WO 2004/107048 A2 | | 12/2004 |
| WO | WO 2005/001432 A2 | | 1/2005 |
| WO | WO 2005/003864 A2 | | 1/2005 |
| WO | WO 2005/006026 A2 | | 1/2005 |
| WO | WO 2005/008339 A2 | | 1/2005 |
| WO | WO 2005/013008 A2 | | 2/2005 |
| WO | WO 2005/015283 A1 | | 2/2005 |
| WO | WO 2005/017625 A2 | | 2/2005 |
| WO | WO 2005/019935 A2 | | 3/2005 |
| WO | WO 2005/022266 A2 | | 3/2005 |
| WO | WO 2005/024325 A2 | | 3/2005 |
| WO | WO 2005/024517 A2 | | 3/2005 |
| WO | WO 2005/034174 A2 | | 4/2005 |
| WO | WO 2005/050324 A2 | | 6/2005 |
| WO | WO 2005/054953 A2 | | 6/2005 |
| WO | WO 2005/054955 A2 | | 6/2005 |
| WO | WO 2005/059617 A2 | | 6/2005 |
| WO | WO 2005/059618 A2 | | 6/2005 |
| WO | WO 2005/059645 A2 | | 6/2005 |
| WO | WO 2005/059654 A1 | | 6/2005 |
| WO | WO 2005/062128 A2 | | 7/2005 |
| WO | WO 2005/064400 A2 | | 7/2005 |
| WO | WO 2005/064405 A2 | | 7/2005 |
| WO | WO 2005/069055 A2 | | 7/2005 |
| WO | WO 2005/069078 A1 | | 7/2005 |
| WO | WO 2005/069081 A2 | | 7/2005 |
| WO | WO 2005/071491 A2 | | 8/2005 |
| WO | WO 2005/074606 A2 | | 8/2005 |
| WO | WO 2005/076084 A1 | | 8/2005 |
| WO | WO 2005/081030 A1 | | 9/2005 |
| WO | WO 2005/081067 A1 | | 9/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3$^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

Technology Symposium, SEMI (Semiconductor Equipment and Materials International), Dec. 4, 2003, "Present Status of Immersion Lithography", Masaomi Kameyama.

The Society of Polymer Science, Japan, Jan. 20, 2004, "Immersion Lithography and NGL", Masaomi Kameyama.

Feb. 10, 2009 Office Action issued in JP 2005-504056 with English translation.

Jul. 7, 2009 Notice of Allowance issued in JP 2005-504056 with English translation.

Jul. 13, 2004 International Search Report and Written Opinion issued in PCT/JP2004/003928 with English translation.

Sep. 5, 2007 European Search Report issued in EP 04722659.2.

Mar. 31, 2008 Notice of Allowance issued in U.S. Appl. No. 11/230,572.

Apr. 3, 2008 Notice of Allowance issued in U.S. Appl. No. 11/230,572.

May 5, 2010 Office Action issued in U.S. Appl. No. 11/498,183.

Aug. 27, 2010 Notice of Allowance issued in U.S. Appl. No. 11/498,183.

Aug. 20, 2010 Office Action issued in U.S. Appl. No. 11/648,694.

Jan. 4, 2011 Notice of Reasons for Rejection issued in Japanese Application No. 2009-096101 with English translation.

Jan. 11, 2011 Notice of Grounds for Rejection issued in Korean Application No. 2005-7017763 with English translation.

Apr. 5, 2011 Office Action issued in Japanese Patent Application No. 2009-096101 (with translation).

Jun. 18, 2009 Office Action issued in European Application No. 04722659.

Jul. 13, 2004 International Search Report issued in International Application No. PCT/JP2004/003928.

Jun. 18, 2009 European Search Report issued in European Application No. 04722659.

Jul. 27, 2009 Office Action issued in U.S. Appl. No. 11/498,183.

Nov. 17, 2008 Office Action issued in U.S. Appl. No. 11/498,183.

Oct. 6, 2008 Office Action issued in U.S. Appl. No. 11/648,694.

Apr. 16, 2009 Office Action issued in U.S. Appl. No. 11/648,694.

Oct. 26, 2009 Office Action issued in U.S. Appl. No. 11/648,694.

Nov. 30, 2005 Office Action issued in U.S. Appl. No. 11/230,572.

Sep. 18, 2006 Office Action issued in U.S. Appl. No. 11/230,572.

Jun. 14, 2007 Office Action issued in U.S. Appl. No. 11/230,572.

Aug. 22, 2008 Office Action issued in U.S. Appl. No. 11/230,572.

May 4, 2011 Office Action issued in U.S. Appl. No. 11/648,694.

Jul. 5, 2011 Office Action issued in Japanese Patent Application No. 2009-096101 (with translation).

* cited by examiner

US 8,018,570 B2

EXPOSURE APPARATUS AND DEVICE FABRICATION METHOD

CROSS-REFERENCE TO RELATED APPLICATION

This is a Divisional of U.S. patent application Ser. No. 11/230,572 filed Sep. 21, 2005, which in turn is a Continuation of International Application No. PCT/JP2004/003928, filed Mar. 23, 2004, which claims priority to Japanese Patent Application No. 2003-83329, filed Mar. 25, 2003. The contents of the aforementioned applications are incorporated herein by reference in their entireties.

BACKGROUND OF THE INVENTION

1. Field of the Invention

The present invention relates to an exposure apparatus that exposes a pattern on a substrate via a projection optical system and a liquid in a state wherein the liquid is filled in at least one part of a space between the projection optical system and the substrate; and a device fabrication method that uses this exposure apparatus.

2. Description of Related Art

Semiconductor devices and liquid crystal devices are fabricated by a so-called photolithography technique, wherein a pattern formed on a mask is transferred onto a photosensitive substrate.

An exposure apparatus used by this photolithographic process includes a mask stage that supports the mask, and a substrate stage that supports the substrate, and transfers the pattern of the mask onto the substrate via a projection optical system while successively moving the mask stage and the substrate stage. There has been demand in recent years for higher resolution projection optical systems in order to handle the much higher levels of integration of device patterns. As the exposure wavelength to be used is shorter, the resolution of the projection optical system becomes higher. As the numerical aperture of the projection optical system is larger, the resolution of the projection optical system becomes higher. Consequently, the exposure wavelength used in exposure apparatuses has shortened year by year, and the numerical aperture of projection optical systems has also increased. Furthermore, the currently mainstream exposure wavelength is the 248 nm KrF excimer laser, but an even shorter wavelength 193 nm ArF excimer laser is also being commercialized. In addition, as well as resolution, the depth of focus (DOF) is also important when performing an exposure. The following equations respectively express the resolution R and the depth of focus δ.

$$R = k_1 \cdot \lambda/NA \quad (1)$$

$$\delta = \pm k_2 \cdot \lambda/NA^2 \quad (2)$$

Therein, $\lambda$ is the exposure wavelength, NA is the numerical aperture of the projection optical system, and $k_1$ and $k_2$ are the process coefficients. Equations (1) and (2) teach that, when the exposure wavelength $\lambda$ is shortened and the numerical aperture NA is increased in order to enhance the resolution R, then the depth of focus δ is narrowed.

If the depth of focus δ becomes excessively narrow, then it will become difficult to align the surface of the substrate with the image plane of the projection optical system, and there will be a risk of insufficient margin during exposure operation. Accordingly, a liquid immersion method has been proposed, as disclosed in, for example, PCT International Publication WO99/49504, as a method to substantially shorten the exposure wavelength and increase the depth of focus. This liquid immersion method fills a liquid, such as water or an organic solvent, between the lower surface of the projection optical system and the surface of the substrate, thus taking advantage of the fact that the wavelength of the exposure light in a liquid is 1/n that of in air (where n is the refractive index of the liquid, normally approximately 1.2-1.6), thereby improving the resolution as well as increasing the depth of focus by approximately n times.

Incidentally, inside the chamber of a conventional exposure apparatus (an exposure apparatus for dry exposure), the humidity is lowered and an airflow is generated by an air conditioner, which creates an atmosphere in which liquids tend to vaporize. Accordingly, if it is decided to perform immersion exposure in an environment similar to the inside of the chamber of the conventional exposure apparatus, then there is a possibility that the liquid for the immersion exposure will vaporize, making it impossible to maintain the control accuracy of the temperature of that liquid, the projection optical system (a part of the optical elements) in contact with that liquid, or the substrate. In addition, variations in the temperature of the projection optical system degrade the projected image, and variations in the temperature of the substrate deform (expand and contract) the substrate, creating the possibility that the pattern overlay accuracy will degrade.

The present invention has been made considering such circumstances, and has an object to provide an exposure apparatus and device fabrication method capable of accurately forming the image of a pattern on a substrate when performing the exposure process based on the liquid immersion method. It is another object of the present invention to provide an exposure apparatus and device fabrication method capable of setting and maintaining at a desired temperature the liquid for liquid immersion exposure, and a substrate that is to be exposed.

SUMMARY OF THE INVENTION

An exposure apparatus of the present invention is an exposure apparatus that fills a liquid in at least one part of a space between a projection optical system and a substrate, projects the image of a pattern via the projection optical system and the liquid onto the substrate, and exposes the substrate, includes a vaporization suppression apparatus that suppresses vaporization of the liquid.

In addition, the device fabricating method of the present invention uses the exposure apparatus as recited above.

According to the present invention, the vaporization suppression apparatus suppresses the vaporization of the liquid for immersion exposure, and the desired temperature can therefore be set and maintained by suppressing change in the temperature of the projection optical system, the substrate, or the liquid for immersion exposure due to the vaporization of the liquid. Accordingly, degradation of the projected image of the projection optical system and deformation of the substrate caused by temperature changes can be suppressed, and the image of the pattern can thereby be formed on the substrate with good accuracy.

An exposure apparatus of the present invention is an exposure apparatus that fills a liquid in at least one part of a space between a projection optical system and a substrate, projects the image of a pattern via the projection optical system and the liquid onto the substrate, and exposes the substrate, includes a member that forms a closed space that surrounds the portion that contacts the liquid; and a vapor pressure adjusting-device to adjust the vapor pressure of the interior of that closed space higher than the vapor pressure of the exterior of that closed space.

In addition, the device fabricating method of the present invention uses the exposure apparatus as recited above.

According to the present invention, because of the high vapor pressure of the closed space, which includes the portion that contacts the liquid, the change in the temperature of the portion such as the projection optical system or the substrate that contacts the liquid, due to the vaporization of the liquid, is suppressed. Accordingly, the image of the pattern can thereby be formed on the substrate with good accuracy.

DETAILED DESCRIPTION OF THE INVENTION

The following explains the preferred embodiments of the present invention, referencing the drawings. However, the present invention is not limited to the embodiments below, e.g., the constituent elements of these embodiments may be mutually combined in a suitable manner, and other well-known configurations may be supplemented or substituted.

Figure 1:
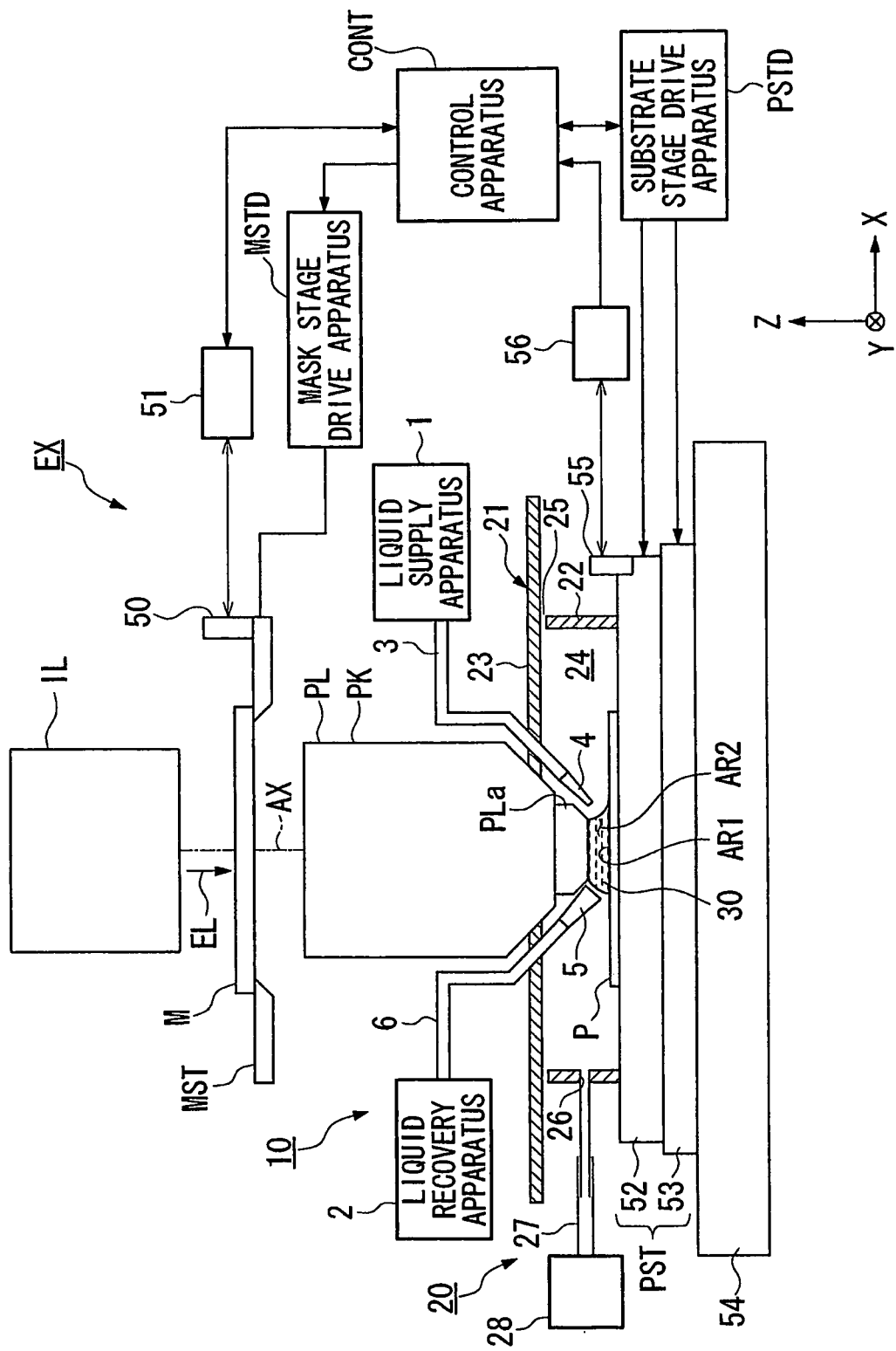
FIG. 1 is a schematic diagram that depicts the first embodiment of an exposure apparatus according to the present invention.

FIG. 1 is a schematic diagram that depicts the first embodiment of an exposure apparatus EX according to the present invention.

In FIG. 1, the exposure apparatus EX includes a mask stage MST that supports a mask M, a substrate stage PST that supports a substrate P, an illumination optical system IL that illuminates with an exposure light EL the mask M supported by the mask stage MST, a projection optical system PL that projects and exposes a pattern image of the mask M illuminated by the exposure light EL onto the substrate P supported by the substrate stage PST, and a control apparatus CONT that provides overall control of the operation of the entire exposure apparatus EX. The exposure apparatus EX of the present embodiment is a liquid immersion type exposure apparatus that applies the liquid immersion method to substantially shorten the exposure wavelength, improve the resolution, as well as substantially increase the depth of focus, and includes an immersion unit 10 that forms an immersion area AR2 by filling with a liquid 30 at least one part of a space between the projection optical system PL and the substrate P.

The immersion unit 10 includes a liquid supply apparatus 1 that supplies the liquid 30 onto the substrate P, and a liquid recovery apparatus 2 that recovers the liquid 30 on the substrate P. At least during the transfer of the pattern image of the mask M onto the substrate P, the exposure apparatus EX forms the immersion area AR2 of the liquid 30 supplied from the liquid supply apparatus 1, in one part on the substrate P that includes a projection area AR1 of the projection optical system PL. Specifically, the exposure apparatus EX fills the space between an optical element PLa of the tip part of the projection optical system PL and the surface of the substrate P with the liquid 30; projects the pattern image of the mask M onto the substrate P via the liquid 30 between the optical element PLa of this projection optical system PL and the substrate P, and via the projection optical system PL; and exposes the substrate P. Furthermore, the exposure apparatus EX includes a vaporization suppression unit 20 that constitutes at least one part of a vaporization suppression apparatus that suppresses the vaporization of the liquid 30, which is discussed in detail later.

The present embodiment will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the direction that coincides with an optical axis AX of the projection optical system PL is the Z axial direction, the direction in which the mask M and the substrate P synchronously move in the plane perpendicular to the Z axial direction (the scanning direction) is the X axial direction, and the direction perpendicular to the Z axial direction and the Y axial direction is the Y axial direction (the non-scanning direction). In addition, the directions around the X, Y, and Z-axes are the θX, θY, and θZ directions. Herein, "substrate" includes one in which a semiconductor wafer is coated with a photoresist, which is a photosensitive material, and "mask" includes a reticle formed with a device pattern subject to the reduction projection onto the substrate.

The illumination optical system IL illuminates with the exposure light EL the mask M supported by the mask stage MST, and includes an exposure light source, an optical integrator that uniformizes the intensity of the luminous flux emitted from the exposure light source, a condenser lens that condenses the exposure light EL from the optical integrator, a relay lens system, and a variable field stop that sets an illumination region on the mask M illuminated by the exposure light EL to be slit-shaped, and the like. The illumination optical system IL illuminates the prescribed illumination region on the mask M with the exposure light EL, having a uniform illumination intensity distribution. Those usable as the exposure light beam EL radiated from the illumination optical system IL include, for example, bright lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). ArF excimer laser light is used in the present embodiment.

The mask stage MST supports the mask M, and is two dimensionally movable in the plane perpendicular to the optical axis AX of the projection optical system PL, i.e., in the XY plane, and is finely-rotatable in the θZ direction. A mask stage drive apparatus MSTD, includes a linear motor and the like, drives the mask stage MST. The control apparatus CONT controls the mask stage drive apparatus MSTD. A movable mirror 50 is provided on the mask stage MST. In addition, a laser interferometer 51 is provided at a position opposing the movable mirror 50. The laser interferometer 51 measures in real time the position, in the two dimensional direction, and the rotational angle of the mask M on the mask stage MST, and outputs the measurement results to the control apparatus CONT. The control apparatus CONT drives the mask stage drive apparatus MSTD based on the measurement results of the laser interferometer 51, thereby positioning the mask M, which is supported by the mask stage MST.

The projection optical system PL projects and exposes the pattern of the mask M onto the substrate P with a predetermined projection magnification β. The projection optical system PL includes a plurality of optical elements, including the optical element (lens) PLa provided at the tip part on the substrate P side. These optical elements are supported by a lens barrel PK. In the present embodiment, the projection optical system PL is a reduction system having a projection magnification β of, for example, ¼ or ⅕. The projection optical system PL may be either a unity magnification system or an enlargement system. In addition, the optical element PLa of the tip part of the projection optical system PL of the present embodiment is attachably and detachably (replaceably) provided to and from the lens barrel PK, and the liquid 30 that forms the immersion area AR2 contacts the optical element PLa.

The substrate stage PST supports the substrate P. The substrate stage PST includes a Z stage 52 that holds the substrate P via a substrate holder, and an XY stage 53 that supports the Z stage 52. Further, a base 54 supports the XY stage 53 of this substrate stage PST. A substrate stage drive apparatus PSTD includes a linear motor and the like, drives the substrate stage PST. The control apparatus CONT controls the substrate stage drive apparatus PSTD. Driving the Z stage 52 controls the position in the Z axial direction (the focus position) and in the θX and θY directions of the substrate P held on the Z stage 52. In addition, driving the XY stage 53 controls the position of the substrate P in the XY direction (the position in a direction substantially parallel to the image plane of the projection optical system PL). In other words, the Z stage 52 controls the focus position and the inclination angle of the substrate P and aligns the surface of the substrate P with the image plane of the projection optical system PL in an autofocus manner and an auto-leveling manner. Further, the XY stage 53 positions the substrate P in the X axial direction and Y axial direction. Furthermore, the Z stage and the XY stage may be integrally provided. A movable mirror 55 is provided on the substrate stage PST (the Z stage 52). In addition, a laser interferometer 56 is provided at a position opposing the movable mirror 55. The laser interferometer 56 measures in real time the position in the two dimensional direction and the rotational angle of the substrate P on the substrate stage PST, and outputs the measurement results to the control apparatus CONT. The control apparatus CONT drives the substrate stage drive apparatus PSTD based on the measurement results of the laser interferometer 56, thereby positioning the substrate P supported on the substrate stage PST.

The liquid supply apparatus 1 of the immersion unit 10 fills with the liquid 30 at least one part of the space between the projection optical system PL and the substrate P by supplying the prescribed liquid 30 onto the substrate P. The liquid supply apparatus 1 includes a tank that accommodates the liquid 30, a filter that eliminates foreign matter from the liquid 30, a pressure pump, and the like. Furthermore, the liquid supply apparatus 1 includes a temperature adjusting-device that adjusts the temperature of the liquid 30 supplied onto the substrate P. The temperature adjusting-device adjusts the temperature of the liquid 30 to be supplied to substantially the same level as, for example, the temperature of the space inside the chamber apparatus housed by the exposure apparatus EX. One end of a supply pipe 3 is connected to the liquid supply apparatus 1, and a supply nozzle 4 is connected to the other end of the supply pipe 3. The supply nozzle 4 is disposed close to the substrate P, and the liquid supply apparatus 1 supplies the liquid 30 between the projection optical system PL and the substrate P via the supply pipe 3 and the supply nozzle 4. In addition, the control apparatus CONT controls the operation of supplying the liquid of the liquid supply apparatus 1, and can control the liquid supply amount per unit time of the liquid supply apparatus 1.

In the present embodiment, pure water is used as the liquid 30. Pure water is capable of transmitting not only ArF excimer laser light, but also deep ultraviolet light (DUV light), such as the bright lines (g, h, and i lines) in the ultraviolet region emitted from, for example, a mercury lamp, and KrF excimer laser light (248 nm wavelength).

The liquid recovery apparatus 2 recovers the liquid 30 on the substrate P, and includes a suction apparatus, such as, for example, a vacuum pump, a tank that accommodates the recovered liquid 30, and the like. One end of a recovery pipe 6 is connected to the liquid recovery apparatus 2, and a recovery nozzle 5 is connected to the other end of the recovery pipe 6. The recovery nozzle 5 is disposed close to the substrate P, and the liquid recovery apparatus 2 recovers the liquid 30 via the recovery nozzle 5 and the recovery pipe 6. In addition, the control apparatus CONT controls the operation of recovering the liquid by the liquid recovery apparatus 2, and can control the liquid recovery amount per unit time of the liquid recovery apparatus 2.

The control apparatus CONT drives the liquid supply apparatus 1 to supply a predetermined amount of liquid 30 per unit of time on the substrate P via the supply pipe 3 and the supply nozzle 4, and drives the liquid recovery apparatus 2 to recover a predetermined amount of liquid 30 per unit of time from on the substrate P via the recovery nozzle 5 and the recovery pipe 6. Thereby, the liquid 30 is disposed between the tip part PLa of the projection optical system PL and the substrate P, forming the immersion area AR2.

The vaporization suppression unit 20 suppresses the vaporization of the liquid 30 by setting the space surrounding the liquid 30 higher than a predetermined vapor pressure. This vaporization suppression unit 20 includes a partition member 21 that encloses the space surrounding the liquid 30 between the projection optical system PL and the substrate P, and a humidifier 28 that constitutes at least one part of a supply apparatus that supplies vapor to a closed space 24, which is formed by the partition member 21 and includes the space surrounding the liquid 30. The partition member 21 includes a wall member 22 affixed to the vicinity of a circumferential edge part of the substrate stage PST (Z stage 52) so that it encloses the substrate P, and having a wall surface of a predetermined height; and a cover 23 affixed to the lens barrel PK of the projection optical system PL, and having a lower surface substantially parallel to the XY plane and of a predetermined size. The cover 23 may be affixed to a support member (not shown) that supports the projection optical system PL (lens barrel PK). The wall member 22 and the cover 23 that constitute the partition member 21 form the closed space 24 that encloses the substrate P and the liquid 30 between the projection optical system PL and the substrate P. A small gap 25 is formed between an upper end part of the wall member 22 and the lower surface of the cover 23 so that the movement of the substrate stage PST in the X, Y, and Z axial directions and the inclination of the substrate stage PST are not interfered. In addition, through holes through which the supply pipe 3 and the recovery pipe 6 can be respectively disposed are provided in one part of the cover 23. Sealing members (not shown) are provided that each restrict the flow of liquid through the gap between the through holes and the respective supply pipe 3 and collection pipe 6.

A through hole 26 is formed in one part of the wall member 22 provided on the substrate stage PST, and one end of an elastically provided piping 27 is connected to this through hole 26. Meanwhile, the humidifier 28 that supplies vapor to the closed space 24 is connected to the other end of the piping 27. The humidifier 28 supplies high humidity gas to the closed space 24 via the piping 27, and supplies a vapor of the same substance as the liquid 30. In the present embodiment, the liquid 30 is water (pure water), so the humidifier 28 supplies water vapor to the closed space 24. The control apparatus CONT controls the vapor supply operation of the humidifier 28. Furthermore, by supplying vapor to the closed space 24 using the humidifier 28, the vaporization suppression unit 20 raises the vapor pressure (pressure in the vapor phase) in the closed space 24 on the inner side of the partition member 21 higher than the outer side thereof (i.e., the interior of the chamber apparatus).

Figure 2:
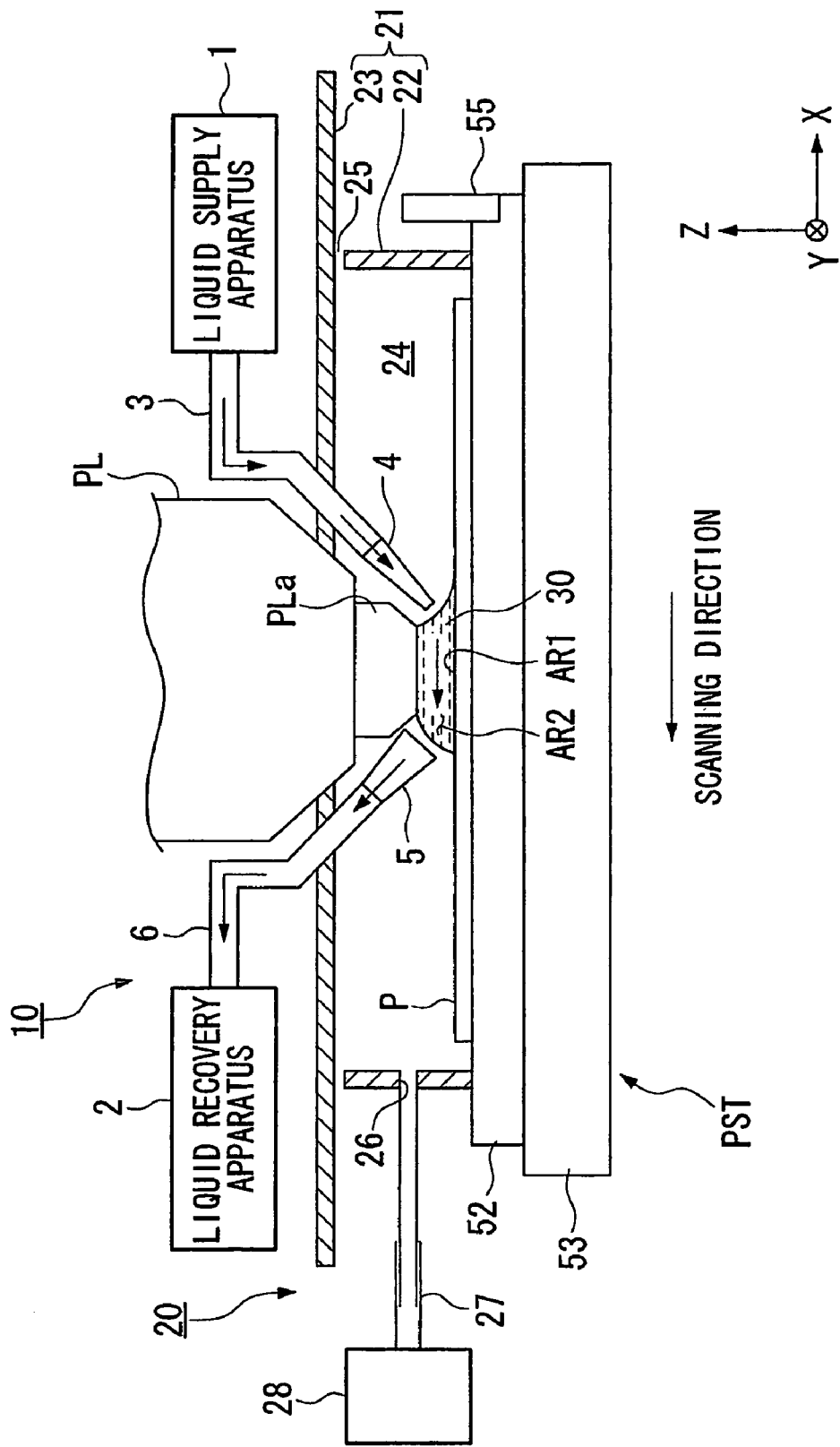
FIG. 2 is an enlarged view of the principal parts in the vicinity of a projection optical system.

FIG. 2 is a front view that depicts the vicinity of the tip part of the projection optical system PL of the exposure apparatus EX. The tip part of the optical element PLa at the lowest end of the projection optical system PL is formed in a long, thin rectangular shape in the Y axial direction (the non-scanning direction), leaving just the portion needed in the scanning direction. During scanning exposure, the pattern image of one part of the mask M is projected onto the rectangular projection area AR1 directly below the optical element PLa, and, synchronized to the movement of the mask M at a speed V in the −X direction (or the +X direction) with respect to the projection optical system PL, the substrate P moves at a speed β·V (where β is the projection magnification) in the +X direction (or the −X direction) via the XY stage 53. Further, after the exposure of one shot region is completed, the next shot region moves to the scanning start position by the stepping movement of the substrate P, and the exposure process is subsequently performed sequentially for each shot region by the step-and-scan system. In the present embodiment, the liquid 30 is set so that it flows parallel to and in the same direction as the movement direction of the substrate P.

Figure 3:
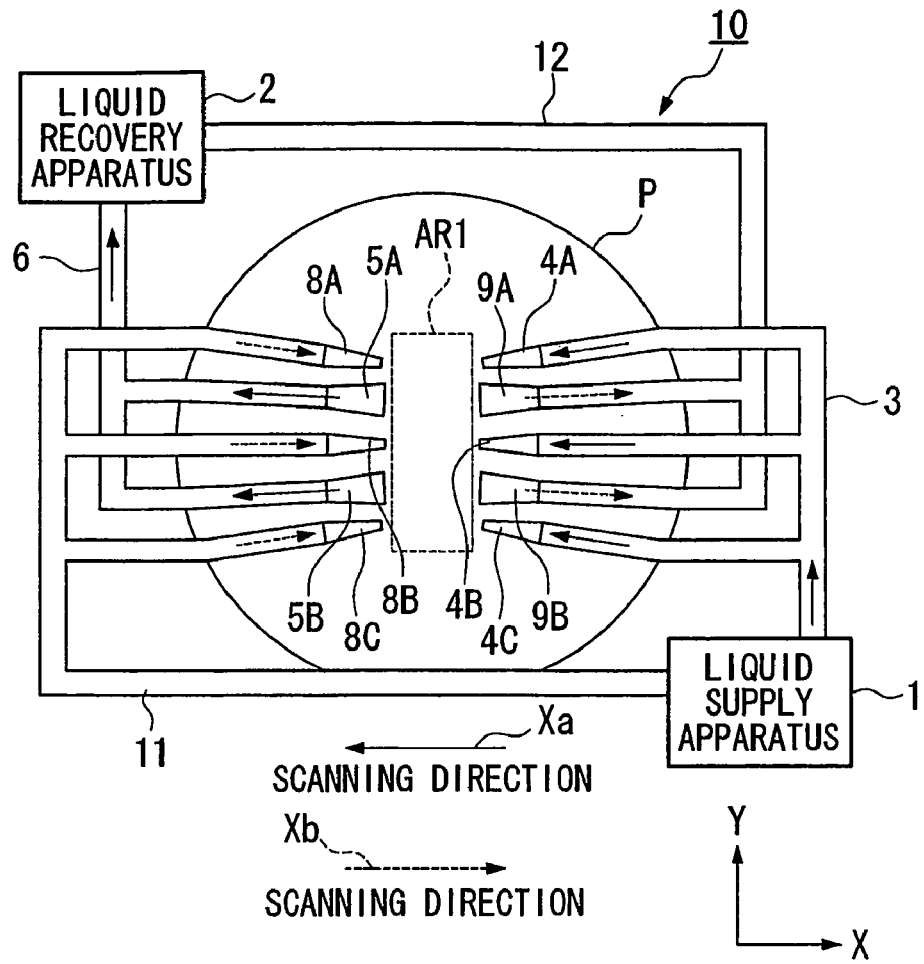
FIG. 3 is a view that depicts an exemplary arrangement of supply nozzles and collection nozzles.

FIG. 3 depicts the positional relationship between the projection area AR1 of the projection optical system PL, the supply nozzles 4 (4A-4C) that supply the liquid 30 in the X axial direction, and the recovery nozzles 5 (5A, 5B) that recover the liquid 30. In FIG. 3, the projection area AR1 of the projection optical system PL is a rectangular shape that is long and thin in the Y axial direction. Further, the three supply nozzles 4A-4C are disposed on the +X direction side and the two recovery nozzles 5A, 5B are disposed on the −X direction side so that the projection area AR1 is interposed therebetween in the X axial direction. The supply nozzles 4A-4C are connected to the liquid supply apparatus 1 via the supply pipe 3, and the recovery nozzles 5A, 5B are connected to the liquid recovery apparatus 2 via the recovery pipe 6. In addition, supply nozzles 8A-8C and recovery nozzles 9A, 9B are disposed in an arrangement substantially 180° rotated from the supply nozzles 4A-4C and the recovery nozzles 5A, 5B. The supply nozzles 4A-4C and the recovery nozzles 9A, 9B are alternately arrayed in the Y axial direction, the supply nozzles 8A-8C and the recovery nozzles 5A, 5B are alternately arrayed in the Y axial direction, the supply nozzles 8A-8C are connected to the liquid supply apparatus 1 via a supply pipe 11, and the recovery nozzles 9A, 9B are connected to the liquid recovery apparatus 2 via a recovery pipe 12.

The following explains the procedure for using the exposure apparatus EX discussed above to expose the pattern of the mask M onto the substrate P.

After the mask M is loaded on the mask stage MST and the substrate P is loaded on the substrate stage PST, the control apparatus CONT drives the liquid supply apparatus 1 and the liquid recovery apparatus 2 of the immersion unit 10, and forms the immersion area AR2 between the projection optical system PL and the substrate P. In addition, the control apparatus CONT drives the humidifier 28 of the vaporization suppression unit 20, thereby supplying vapor to the closed space 24 that includes the surrounding space of liquid 30 that is formed by the immersion area AR2, thereby the vapor phase pressure of this closed space 24 becomes higher than a predetermined vapor pressure. Specifically, by supplying the water vapor, which is a high humidity gas, to the closed space 24, the vaporization suppression unit 20 sets this closed space 24 to the saturated vapor pressure of the liquid (pure water) 30.

The vapor pressure of the closed space 24 rises higher than the vapor pressure on the outside of the closed space 24. Normally, the humidity on the outside of the closed space 24, i.e., inside the chamber that houses the exposure apparatus EX, is 30%-40%, but the interior of the space 24 is constantly maintained near the saturated vapor pressure (approximately 95% humidity) because the humidifier 28 of the vaporization suppression unit 20 is continuously supplying water vapor. It is possible to maintain the interior of the space 24 near the saturated vapor pressure because the gap 25 provided between the upper end part of the wall member 22 and the cover 23 is extremely small.

If scanning exposure is performed by moving the substrate P in the scanning direction (the −X direction) depicted by an arrow Xa (refer to FIG. 3), then the liquid supply apparatus 1 and the liquid recovery apparatus 2 use the supply pipe 3, the supply nozzles 4A-4C, the recovery pipe 6, and the recovery nozzles 5A, 5B to supply and recover the liquid 30. On the other hand, if scanning exposure is performed by moving the substrate P in the scanning direction (the +X direction) depicted by an arrow Xb, then the liquid supply apparatus 1 and the liquid recovery apparatus 2 use the supply pipe 11, the supply nozzles 8A-8C, the recovery pipe 12, and the recovery nozzles 9A, 9B to supply and recover the liquid 30. Thus, the immersion unit 10 uses the liquid supply apparatus 1 and the liquid recovery apparatus 2 to flow the liquid 30 along the direction of movement of the substrate P and in a direction the same as the direction of movement of the substrate P. In this case, the liquid 30 can be easily supplied between the projection optical system PL and the substrate P, even if the supplied energy of the liquid supply apparatus 1 is small, because the liquid 30 supplied, for example, from the liquid supply apparatus 1 via the supply nozzles 4A-4C flows so that it is drawn between the projection optical system PL and the substrate P as the substrate P moves in the −X direction. Further, even if the substrate P is scanned in either the +X direction or the −X direction by switching the direction in which the liquid 30 flows in accordance with the scanning direction, the liquid 30 can be filled between the projection optical system PL and the substrate P, and a high resolution and large depth of focus can thereby be obtained. In addition, because the minute gap 25 is provided between the upper end part of the wall member 22 and the cover 23, the substrate stage PST can also be moved while maintaining the inside of the closed space 24 near the saturated vapor pressure.

As explained above, the partition member 21 forms the closed space 24 surrounding the substrate P and the liquid 30 that forms the immersion area AR2, and water vapor is supplied inside this closed space 24; therefore, the vaporization of the liquid 30 and of the liquid 30 adhering to the tip part of the projection optical system PL and the substrate P can be suppressed, and the liquid 30, the projection optical system PL, and the substrate P can be maintained at the desired temperature. In particular, if an immersion area is formed on one part of the substrate P while recovering the liquid on the substrate P, then, even if the un-recovered residual liquid adheres to the substrate P, the vaporization of that residual liquid can be prevented, and it is possible to suppress temperature changes and deformations (expansion and contraction) of the substrate P. In addition, even if liquid adheres to the side surfaces of the optical element PLa of the projection optical system PL, the vaporization of that adhered liquid can be prevented, thereby enabling the suppression of temperature changes and deformation of the optical element PLa.

In the present embodiment, the movable mirror 55 affixed to the substrate stage PST is provided on the outside of the closed space 24, and the measurement of the position of the substrate stage PST by the interferometer 56 using the movable mirror 55 is consequently not affected by the environment inside the closed space 24. In addition, because water vapor of pure water the same as the liquid (pure water) 30 is supplied to the closed space 24 to humidify the closed space 24, there is no drop in the purity of the liquid (pure water) 30 between the projection optical system PL and the substrate P, nor any change in the transmittance or other characteristics.

In the present embodiment, the vapor supplied to the closed space 24 has the same physical properties as the liquid 30 that forms the immersion area AR2. However, if deterioration in the purity of the liquid 30 between the projection optical system PL and the substrate P is permissible to some extent, then the physical properties of the liquid 30 supplied from the liquid supply apparatus 1 for forming the immersion area AR2 need not be the same as those of the vapor supplied inside the closed space 24.

In the present embodiment, the interior of the closed space 24 is set to substantially the saturated vapor pressure (approximately 95% humidity), but may be set lower than that, e.g., approximately 60%. In other words, the pressure of the vapor phase of the closed space 24 may be set to a predetermined vapor pressure that is lower than the saturated vapor pressure. Here, the predetermined vapor pressure is a pressure wherein fluctuations in the pattern transfer accuracy due to temperature fluctuations in the tip part of the projection optical system PL, the substrate P, or the liquid 30 caused by vaporization of the liquid 30 can be kept within a permissible range. Accordingly, by setting the space surrounding the liquid 30 for forming the immersion area AR2 higher than the predetermined vapor pressure with the aid of the vaporization suppression unit 20, the pattern transfer accuracy can be kept within the permissible range.

Although the liquid 30 in the present embodiment is water (pure water), it may be a liquid other than water. For example, if the light source of the exposure light EL is an $F_2$ laser, then this $F_2$ laser light will not transmit through water, so it would be acceptable to use as the liquid 30 a fluorine based liquid, such as fluorine based oil, capable of transmitting the $F_2$ laser light (e.g., Fomblin® and PFPE). In that case, the vapor of the fluorine based liquid is supplied to the space surrounding the substrate P (the closed space 24). If a fluorine based liquid is used for the immersion exposure, then a substance the same as that liquid may be vaporized, and that vapor may be supplied inside the closed space 24. In addition, it is also possible to use, as the liquid 30, those (e.g., cedar oil) that is transparent to the exposure light EL, has the highest possible refractive index, and is stable with respect to the projection optical system PL and the photoresist coated on the surface of the substrate P.

In either case, vapor having physical properties the same as that liquid, or a vapor having a chemical composition the same as the vapor produced by vaporizing that liquid may be supplied to the space surrounding the substrate P (the closed space 24).

The above embodiments are not particularly limited to the nozzle configurations discussed above, e.g., the liquid 30 may be supplied and recovered by two pairs of nozzles on the long sides of the projection area AR1 of the projection optical system PL. In this case, the supply nozzles and the recovery nozzles may be disposed so that they are arrayed vertically in order to enable the supply and recovery of the liquid 30 from either the +X direction or the −X direction.

Figure 4:
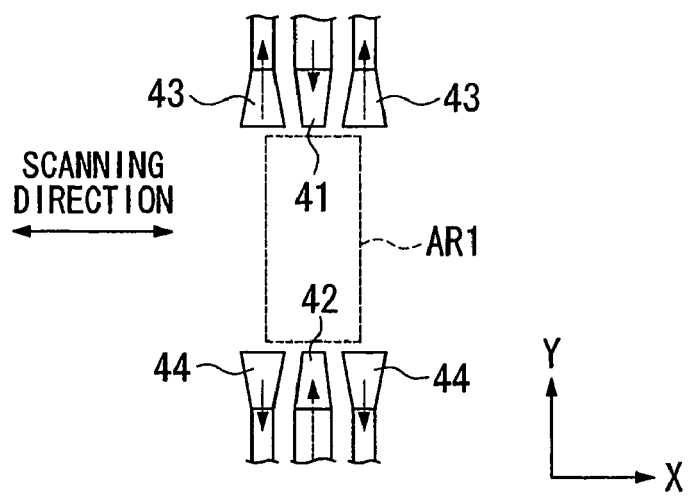
FIG. 4 is a view that depicts an exemplary arrangement of supply nozzles and collection nozzles.

In addition, as shown in FIG. 4, supply nozzles 41, 42 and recovery nozzles 43, 44 may also be provided respectively on both sides in the Y axial direction, wherebetween the projection area AR1 of the projection optical system PL is interposed. These supply nozzles and recovery nozzles can stably supply the liquid 30 between the projection optical system PL and the substrate P, even when the substrate P is moving in the non-scanning direction (the Y axial direction) during the stepping movement. In addition, if the liquid 30 supply nozzles and recovery nozzles are provided so that they surround the projection area AR1 of the projection optical system PL, then it is possible also to switch the direction in which the liquid 30 flows in response to the movement direction of the substrate P at times such as when the substrate P is being stepped in the Y axial direction.

Figure 5:
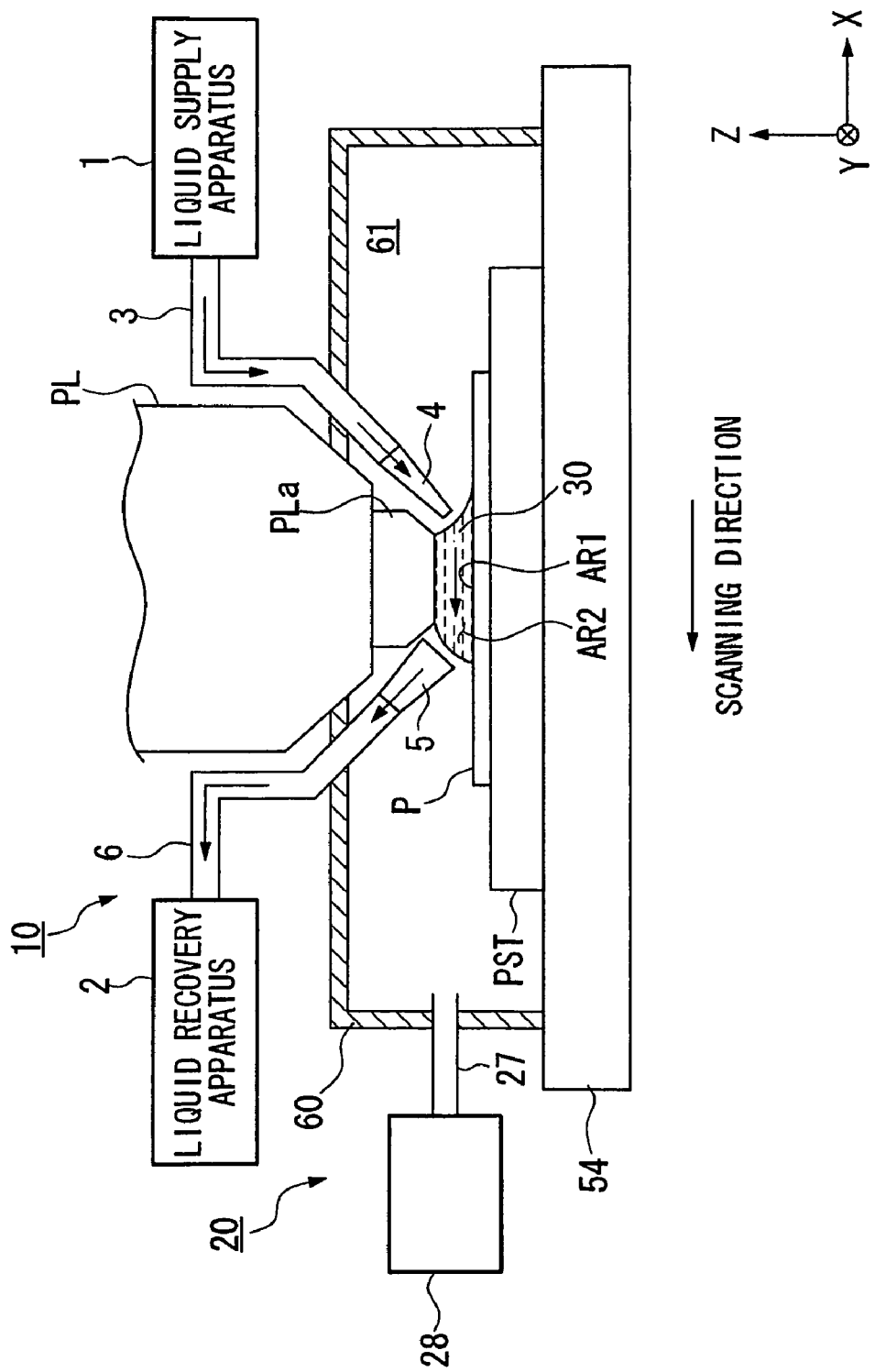
FIG. 5 is an enlarged view of the principal parts of the second embodiment of the exposure apparatus according to the present invention.

The following explains the second embodiment of the exposure apparatus EX according to the present invention, referencing FIG. 5. In the explanation below, constituent parts that are identical or equivalent to those in the first embodiment discussed above are assigned the identical reference characters, and the explanation thereof is simplified or omitted.

In FIG. 5, the vaporization suppression unit 20 includes a partition member 60 affixed onto the base 54. In other words, the partition member 21 according to the abovementioned first embodiment includes the wall member 22 and the cover 23, and forms a gap 25, but there is no gap in the partition member 60 according to the present embodiment, and a closed space 61 formed by this partition member 60 is an approximately sealed closed space. In this case, the substrate stage PST moves inside the closed space 61 on the base 54. By making the closed space 61 an approximately sealed closed space, it is that much easier to maintain the interior of this closed space 61 near the saturated vapor pressure of the liquid 30, and the impact on the outside of the closed space 61 can be eliminated. Here, if the measurement light of the interferometer used to measure the position of the substrate stage PST passes through the interior of the closed space 61, then a tubular member can elastically cover the optical path of the measurement light so that the vapor inside the closed space 61 does not impact the measurement operation.

The abovementioned first and second embodiments are configured so that the space surrounding the substrate P and the liquid 30 for forming the immersion area AR2 are made a closed space, and so that vapor is supplied into this closed space. However, it is also acceptable to suppress the vaporization of the liquid 30 for forming the immersion area AR2 by simply blowing the vapor to the space surrounding the liquid 30 (to the vicinity of the tip part of the projection optical system PL, and to the vicinity of the surface of the substrate P), without forming the closed space. In this case, the same as discussed above, the optical path (luminous flux) of the interferometer may be covered by the tubular member so that the vapor does not affect the interferometer's measurements.

In addition, in the first and second embodiments discussed above, a humidity sensor may be disposed inside the closed spaces 24, 61, and the humidifier 28 may be controlled based on the output of that humidity sensor.

In addition, after the exposure of the substrate P is completed, the vapor pressure inside the closed spaces 24, 61 is made substantially the same as the vapor pressure of the space on the outside of the closed spaces 24, 61, after which the substrate P may be transported out of the closed spaces 24, 61.

In the abovementioned first and second embodiments, a humidifier 28 is provided that supplies vapor to the interior of the closed spaces 24, 61, but it is also acceptable to omit this. In other words, even if only forming the closed spaces 24, 61, the vaporization of the liquid can be suppressed because the liquid that contacts (adheres to) the substrate P and the vicinity of the tip of the projection optical system PL can be protected from contact with the dried air inside the chamber that houses the apparatus, or the airflow inside the chamber.

In addition, the abovementioned first and second embodiments suppress the vaporization of the liquid by forming the closed spaces 24, 61, but it is also acceptable to blow a high vapor pressure (high humidity) vapor toward the vicinity of the tip of the projection optical system PL and the surface of the substrate P, without providing the partition members 21, 60.

In addition, the present invention is not limited to the large closed spaces 24, 61 such as in the first and second embodiments, and a local closed space may be provided so that it encloses the portion that makes contact with (adheres to) the liquid.

As discussed above, the liquid 30 in the present embodiment includes pure water. Pure water is advantageous because it can be easily obtained in large quantities at a semiconductor fabrication plant, and the like. Further, because pure water has no adverse impact on the optical element (lens), the photoresist on the substrate P, and the like. In addition, because pure water has no adverse impact on the environment and has an extremely low impurity content, it can also be expected to have the effect of cleaning the surface of the substrate P, and the surface of the optical element provided on the tip surface of the projection optical system PL. Further, because the refractive index n of pure water (water) for the exposure light EL having a wavelength of approximately 193 nm is substantially 1.44, the use of ArF excimer laser light (193 nm wavelength) as the light source of the exposure light EL would shorten the wavelength on the substrate P to 1/n, i.e., approximately 134 nm, thereby obtaining a high resolution. Furthermore, because the depth of focus will increase approximately n times, i.e., approximately 1.44 times, that of in air, the numerical aperture of the projection optical system PL can be further increased if it is preferable to ensure a depth of focus approximately the same as that when used in air, and the resolution is also improved from this standpoint.

In each of the abovementioned embodiments, a lens is affixed as the optical element PLa at the tip of the projection optical system PL, and the optical characteristics of the projection optical system PL, e.g., aberrations (spherical aberration, coma aberration, and the like) can be adjusted by this lens. The optical element PLa may also be an optical plate that adjusts the above optical characteristics. Further, the optical element PLa that contacts the liquid 30 can also be a plane parallel plate lower in cost than the lens. Using a plane parallel plate as the optical element PLa is advantageous because, even if a substance (e.g., a silicon based organic substance, and the like) that lowers the uniformity of the transmittance of the projection optical system PL during the transport, assembly, and adjustment of the exposure apparatus EX, and the illumination intensity and the illumination intensity distribution of the exposure light EL on the substrate P adheres to that plane parallel plate, only the plane parallel plate needs to be replaced immediately before supplying the liquid, and that replacement cost is lower than that compared with using a lens as the optical element that contacts the liquid. In other words, because the surface of the optical element that contacts the liquid becomes contaminated because of the adhesion of scattered particles generated from the resist due to the irradiation of the exposure light EL, and because of impurities in the liquid, and the like, that optical element must be periodically replaced. However, by using a low cost plane parallel plate for this optical element, the cost of the replacement part is lower compared with a lens, less time is needed to effect the replacement, and it is possible to suppress any increase in the maintenance cost (running cost) or decrease in throughput.

If a high pressure is generated by the flow of the liquid between the substrate P and the optical element PLa at the tip of the projection optical system PL, then instead of making the optical element replaceable, the optical element may be firmly fixed by that pressure so that it does not move.

Each of the abovementioned embodiments is constituted so that the liquid is filled between the projection optical system PL and the surface of the substrate P, but may be constituted so that the liquid is filled in a state wherein, for example, a cover glass comprising a plane parallel plate is affixed to the surface of the substrate P.

The substrate P in each of the above-mentioned embodiments is not limited to a semiconductor wafer for fabricating semiconductor devices, and is also applicable to a glass substrate for a display device, a ceramic wafer for a thin film magnetic head, or a mask or the original plate of a reticle (synthetic quartz, silicon wafer) used by an exposure apparatus, and the like.

In addition to a step-and-scan system scanning type exposure apparatus (scanning stepper) that scans and exposes the pattern of the mask M by synchronously moving the mask M and the substrate P, a step-and-repeat system projection exposure apparatus (stepper) that exposes the full pattern of the mask M with the mask M and the substrate P in a stationary state is also applicable as the exposure apparatus EX. In addition, the present invention is also applicable to a step-and-stitch system exposure apparatus that partially and superimposingly transfers at least two patterns onto the substrate P.

In the embodiments discussed above, an exposure apparatus is used that locally fills liquid between the projection optical system PL and the substrate P, but the present invention is also applicable to a liquid immersion exposure apparatus that moves a stage, which holds the substrate to be exposed, in a liquid bath, as disclosed in Japanese Unexamined Patent Application, First Publication No. H06-124873, as well as to a liquid immersion exposure apparatus that forms a liquid bath having a predetermined depth on the stage, and holding the substrate therein, as disclosed in Japanese Unexamined Patent Application, First Publication No. H10-303114.

In addition, the present invention is also applicable to twin-stage type exposure apparatuses as disclosed in Japanese Unexamined Patent Applications, First Publication No. H10-163099 and No. H10-214783, and Published Japanese Translation No. 2000-505958 of the PCT International Publication.

The type of exposure apparatus EX is not limited to semiconductor device fabrication exposure apparatuses that expose the pattern of a semiconductor device on the substrate P, but is also widely applicable to exposure apparatuses for fabricating liquid crystal devices or displays, exposure apparatuses for fabricating thin film magnetic heads, imaging devices (CCD), or reticles and masks, and the like.

If a linear motor is used in the substrate stage PST or the mask stage MST (refer to U.S. Pat. No. 5,623,853 and U.S. Pat. No. 5,528,118), then either an air levitation type that uses an air bearing or a magnetic levitation type that uses Lorentz's force or reactance force may be used. In addition, each of the stages PST, MST may be a type that moves along a guide, or may be a guideless type not provided with a guide.

For the drive mechanism of each of the stages PST, MST, a planar motor may be used that opposes a magnet unit wherein magnets are arranged two dimensionally to an armature unit wherein coils are arranged two dimensionally, and drives each of the stages PST, MST by electromagnetic force. In this case, any one among the magnet unit and the armature unit is connected to the stages PST, MST, and the other one of the magnet unit and the armature unit should be provided on the moving surface side of the stages PST, MST.

The reaction force generated by the movement of the substrate stage PST may be mechanically discharged to the floor (ground) using a frame member so that it is not transmitted to the projection optical system PL, as recited in Japanese Unexamined Patent Application, First Publication No. H08-166475 (U.S. Pat. No. 5,528,118).

The reaction force generated by the movement of the mask stage MST may be mechanically discharged to the floor (earth) using a frame member so that it is not transmitted to the projection optical system PL, as recited in Japanese Unexamined Patent Application, First Publication No. H08-330224 (USP 5,874,820).

The exposure apparatus EX of the embodiments in the present application as described above is manufactured by assembling various subsystems, including each constituent element recited in the claims of the present application, so that a predetermined mechanical accuracy, electrical accuracy, and optical accuracy are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The assembly process, from the various subsystems to the exposure apparatus includes the mutual mechanical connection of the various subsystems, the wiring and connection of electrical circuits, the piping and connection of the atmospheric pressure circuit, and the like. Naturally, before the process of assembling from these various subsystems to the exposure apparatus, there are processes for assembling each of the individual subsystems. When the assembly process from various subsystems to the exposure apparatus has completed, a comprehensive adjustment is performed to ensure the various accuracies of the exposure apparatus as a whole. It is preferable to manufacture the exposure apparatus in a clean room wherein the temperature, the cleanliness level, and the like, are controlled.

Figure 6:
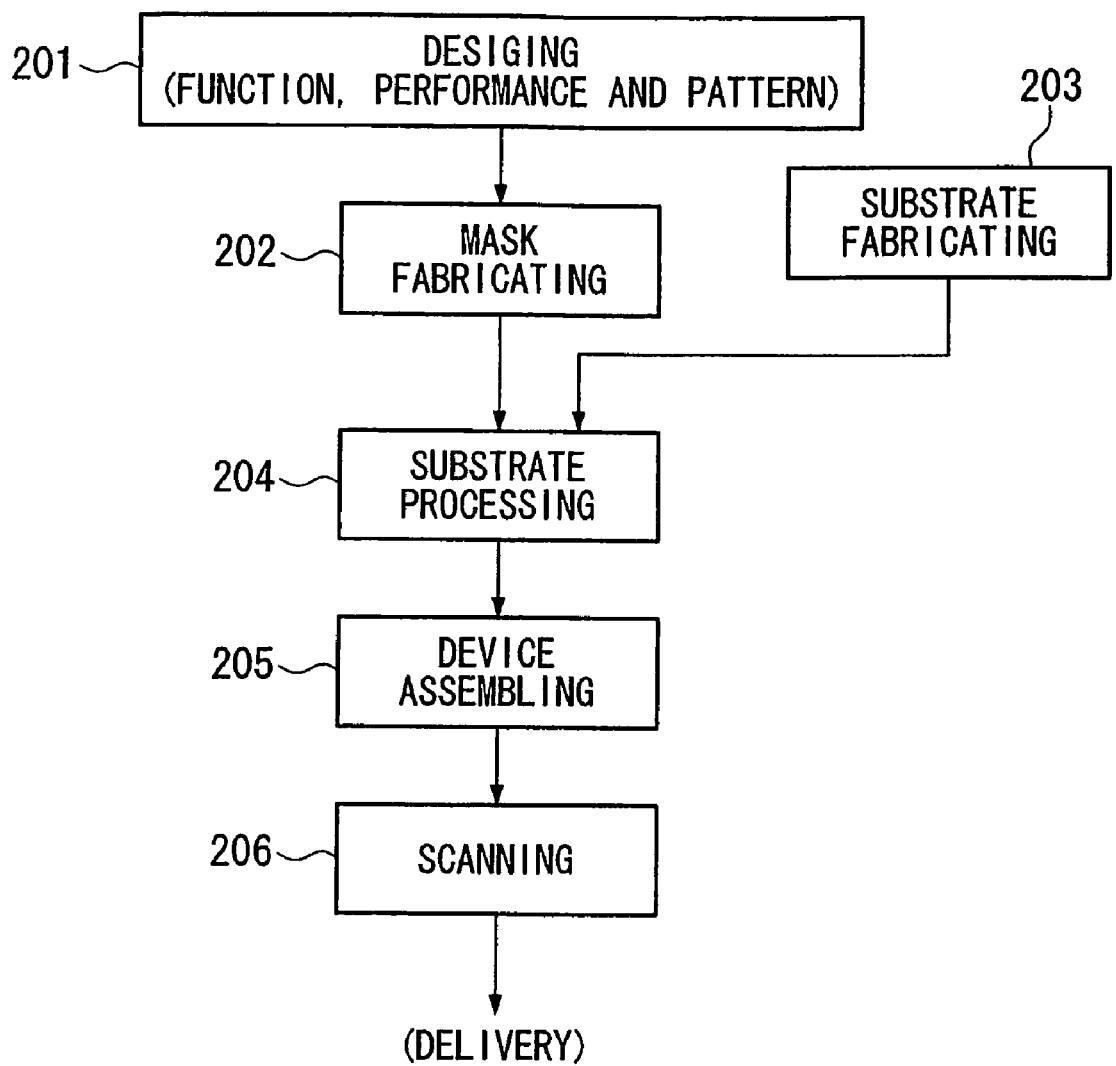
FIG. 6 is a flow chart that depicts one example of a semiconductor device fabrication process.

As shown in FIG. 6, a micro-device, such as a semiconductor device is manufactured by: a step 201 that designs the functions and performance of the micro-device; a step 202 that fabricates a mask (reticle) based on this design step; a step 203 that fabricates a substrate, which is the base material of the device; an exposure processing step 204 wherein the exposure apparatus EX of the embodiments discussed above exposes a pattern of the mask onto the substrate; a device assembling step 205 (comprising a dicing process, a bonding process, and a packaging process); a scanning step 206; and the like.

What is claimed is:

1. A lithographic apparatus, comprising:
   a projection system that projects a patterned radiation beam onto a target portion of a substrate;
   a liquid supply system that supplies a liquid from a supply inlet to at least partly fill a region between the substrate and the projection system with the liquid, such that the liquid supplied from the supply inlet covers only a localized portion of a surface of the substrate; and
   a saturated gas supply system that provides substantially saturated gas to the surface of the substrate not covered by the liquid.

2. The apparatus according to claim 1, further comprising a confinement structure fixed in a plane substantially perpendicular to an optical axis of the projection system and that contains the substantially saturated gas, the confinement structure comprising an extension structure extending substantially radially with respect to the optical axis.

3. The apparatus according to claim 2, wherein the extension structure is arranged to cooperate with a vapor sealing projection, forming a part of a substrate table that holds the substrate, so as to substantially contain the substantially saturated gas.

4. The apparatus according to claim 3, wherein the extension structure and the vapor sealing projection contain the substantially saturated gas in a region delimited by the substrate table, the substrate, the liquid when provided to the region, the confinement structure, the extension structure and the vapor sealing projection.

5. The apparatus according to claim 1, wherein the saturated gas supply system comprises a saturated gas preparer that makes substantially saturated gas from the liquid.

6. A lithographic apparatus, comprising:
   a substrate table that holds a substrate to be exposed;
   a projection system that projects a patterned radiation beam onto a target portion on a side of the substrate to be exposed;
   a liquid supply system that supplies a liquid from a liquid supply inlet to at least partly fill a region between the substrate and the projection system with the liquid, such that the liquid covers only a localized area of the side of the substrate; and
   a confinement structure fixed in a plane substantially perpendicular to an optical axis of the projection system, that cooperates with the substrate table in order to restrict substantially saturated gas to a region above an upper surface of the substrate table,
   wherein the confinement structure and the substrate table are arranged so that the side of the substrate to be exposed is entirely covered with the substantially saturated gas except for an area covered with the liquid during exposure.

7. The apparatus according to claim 6, wherein the substrate table comprises a vapor sealing projection arranged to cooperate with the confinement structure so as to substantially contain the substantially saturated gas.

8. The apparatus according to claim 7, wherein the confinement structure and the vapor sealing projection contain the substantially saturated gas in a region delimited by the substrate table, the substrate, the liquid when provided to the region, the confinement structure and the vapor sealing projection.

9. The apparatus according to claim 6, further comprising a saturated gas supply system that provides the substantially saturated gas to a surface of the substrate not covered by liquid.

10. A lithographic apparatus, comprising:
- a substrate table that holds a substrate to be exposed;
- a projection system that projects a patterned radiation beam onto a target portion of the substrate;
- a liquid supply system that supplies a liquid from a supply inlet to at least partly fill a region between the substrate and the projection system with the liquid, such that the liquid covers only a localized portion of a side of the substrate;
- a saturated gas supply system that provides substantially saturated gas to the side of the substrate not covered by the liquid; and
- a confinement structure fixed in a plane substantially perpendicular to an optical axis of the projection system, that cooperates with the substrate table in order to restrict the substantially saturated gas to a region above an upper surface of the substrate table,
- wherein the confinement structure and the substrate table are arranged so that the side of the substrate to be exposed is entirely covered with substantially saturated gas except for an area covered with the liquid during exposure.

11. The apparatus according to claim 10, wherein the substrate table comprises a vapor sealing projection arranged to cooperate with the confinement structure so as to substantially contain the substantially saturated gas.

12. A device manufacturing method, comprising:
- at least partly filling a region between a projection system of a lithographic apparatus and a substrate with a liquid, such that the liquid covers a localized portion of a surface of the substrate;
- providing a substantially saturated gas to the surface of the substrate not covered by the liquid; and
- projecting a patterned radiation beam through the liquid onto a target portion of the substrate using the projection system.

13. The method according to claim 12, further comprising containing the substantially saturated gas using a confinement structure fixed in a plane substantially perpendicular to an optical axis of the projection system, the confinement structure comprising an extension structure extending substantially radially with respect to the optical axis.

14. The method according to claim 13, comprising substantially containing the substantially saturated gas using the extension structure in cooperation with a vapor sealing projection forming part of a substrate table holding the substrate.

15. The method according to claim 14, comprising containing the substantially saturated gas in a region delimited by the substrate table, the substrate, the liquid when provided to the region, the confinement structure, the extension structure and the vapor sealing projection.

16. The method according to claim 12, further comprising making the substantially saturated gas from the liquid.

17. A device manufacturing method, comprising:
- restricting a liquid to a region between a projection system of a lithographic apparatus and a substrate held on a substrate table of the lithographic apparatus, such that the liquid covers only a localized portion of a side of the substrate;
- restricting substantially saturated gas to a region above an upper surface of the substrate table using a confinement structure that is fixed in a plane substantially perpendicular to the optical axis and arranged to cooperate with the substrate table; and
- projecting a patterned radiation beam through the liquid onto a target portion on the side of the substrate using the projection system,
- wherein the confinement structure and the substrate table are arranged so that the side of the substrate to be exposed is entirely covered with the substantially saturated gas except for an area covered with the liquid during exposure.

18. The method according to claim 17, comprising substantially containing the substantially saturated gas using a vapor sealing projection of the substrate table in cooperation with the confinement structure.

19. The method according to claim 18, comprising substantially containing the substantially saturated gas in a region delimited by the substrate table, the substrate, the liquid when provided to the region, the confinement structure and the vapor sealing projection.

20. The method according to claim 17, further comprising providing the substantially saturated gas to the side of the substrate not covered by liquid.

21. A device manufacturing method, comprising:
- restricting a liquid to a region between a projection system of a lithographic apparatus and a substrate held on a substrate table of the lithographic apparatus, such that the liquid covers only a localized portion of a side of the substrate;
- supplying a substantially saturated gas to the side of the substrate not covered by liquid;
- restricting the substantially saturated gas to a region above an upper surface of the substrate table using a confinement structure that is fixed in a plane substantially perpendicular to the optical axis and arranged to cooperate with the substrate table; and
- projecting a patterned radiation beam through the liquid onto a target portion of the substrate using the projection system,
- wherein the confinement structure and the substrate table are arranged so that the side of the substrate to be exposed is entirely covered with the substantially saturated gas except for an area covered in the liquid during exposure.

22. The method according to claim 21, comprising substantially containing the substantially saturated gas using a vapor sealing projection of the substrate table in cooperation with the confinement structure.

* * * * *